US009074935B2

(12) United States Patent
Nishikawa et al.

(10) Patent No.: US 9,074,935 B2
(45) Date of Patent: Jul. 7, 2015

(54) INFRARED SENSOR

(75) Inventors: Takayuki Nishikawa, Osaka (JP);
Sukoya Tawaratsumida, Mie (JP);
Sadayuki Sumi, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 783 days.

(21) Appl. No.: 13/390,805

(22) PCT Filed: Aug. 6, 2010

(86) PCT No.: PCT/JP2010/063417
§ 371 (c)(1),
(2), (4) Date: Jun. 4, 2012

(87) PCT Pub. No.: WO2011/021519
PCT Pub. Date: Feb. 24, 2011

(65) Prior Publication Data
US 2012/0228503 A1   Sep. 13, 2012

(30) Foreign Application Priority Data

Aug. 17, 2009   (JP) ................................. 2009-188633
Oct. 19, 2009   (JP) ................................. 2009-240903

(51) Int. Cl.
*G01J 5/10*   (2006.01)
*G01J 5/34*   (2006.01)
(Continued)

(52) U.S. Cl.
CPC .... *G01J 5/34* (2013.01); *G01J 5/04* (2013.01); *G01J 5/045* (2013.01); *G01J 5/048* (2013.01);
(Continued)

(58) Field of Classification Search
CPC ........................................................ G01J 5/10
USPC .................................................... 250/338.3
See application file for complete search history.

(56) References Cited

U.S. PATENT DOCUMENTS 4,379,971 A * 4/1983 Smith et al. .................. 250/342
5,440,125 A * 8/1995 Hennins et al. ............ 250/338.1
(Continued)

FOREIGN PATENT DOCUMENTS

CN   101111749   1/2008
CN   101175977   5/2008
(Continued)

OTHER PUBLICATIONS

Chinese Office Action dated Jan. 23, 2014.

*Primary Examiner* — David Porta
*Assistant Examiner* — Faye Boosalis
(74) *Attorney, Agent, or Firm* — Greenblum & Bernstein, P.L.C.

(57) ABSTRACT

The infrared sensor in accordance with the present invention includes a pyroelectric element, an IC device, and a surface-mounted package. The IC device is configured to process an output signal of the pyroelectric element. The package houses the pyroelectric element and the IC device. The package includes a package body and a package lid configured to transmit infrared rays to be detected by the pyroelectric element, and has electrical conductivity. The package body is provided on its surface with plural recessed parts arranged in tiers. The IC device is mounted on a bottom of the lower recessed part. The package body includes an output wiring configured to electrically connect an output terminal of the IC device to an external connection terminal and a shielding member interposed between the pyroelectric element and the output wiring.

14 Claims, 16 Drawing Sheets

(51) Int. Cl.
  *G01J 5/04* (2006.01)
  *G01J 5/06* (2006.01)
  *G01J 5/08* (2006.01)
(52) U.S. Cl.
  CPC .... *G01J 5/06* (2013.01); *G01J 5/08* (2013.01); *G01J 5/0806* (2013.01); *G01J 5/0875* (2013.01); *G01J 5/0881* (2013.01); *G01J 5/0893* (2013.01); *H01L 2224/16225* (2013.01)

(56) References Cited

U.S. PATENT DOCUMENTS

| | | | |
|---|---|---|---|
| 5,818,337 A * | 10/1998 | Erismann | 340/567 |
| 5,917,187 A | 6/1999 | Takada et al. | |
| 7,897,921 B2 * | 3/2011 | Horikawa et al. | 250/338.3 |
| 2008/0087818 A1 | 4/2008 | Li | |
| 2008/0087824 A1 | 4/2008 | Hayashi et al. | |
| 2008/0111087 A1 | 5/2008 | Nishikawa et al. | |
| 2008/0251722 A1 | 10/2008 | Hayashi et al. | |

FOREIGN PATENT DOCUMENTS

| | | |
|---|---|---|
| JP | 04-138246 | 7/1991 |
| JP | 7-190852 | 7/1995 |
| JP | 8-015007 | 1/1996 |
| JP | 8-128893 | 5/1996 |
| JP | 8-313339 | 11/1996 |
| JP | 9-145464 | 6/1997 |
| JP | 11-068029 | 3/1999 |
| JP | 11-281481 | 10/1999 |
| JP | 3367876 | 11/2002 |
| JP | 3372180 | 1/2003 |
| JP | 2003-133603 | 5/2003 |
| JP | 2004-117216 | 4/2004 |
| JP | 3897055 | 3/2007 |
| JP | 3897056 | 3/2007 |
| JP | 2007-292720 | 11/2007 |
| JP | 4-258139 | 4/2009 |
| WO | 2006/120862 | 11/2006 |
| WO | 2006/120863 | 11/2006 |

* cited by examiner

FIG. 11
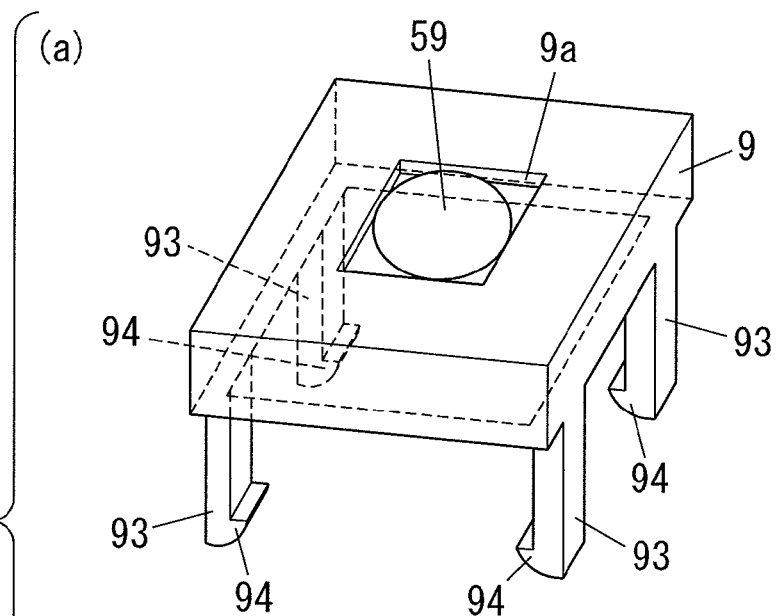
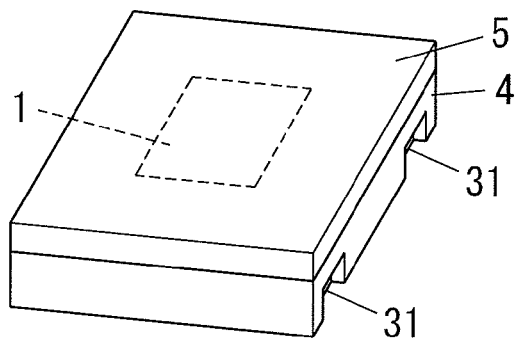
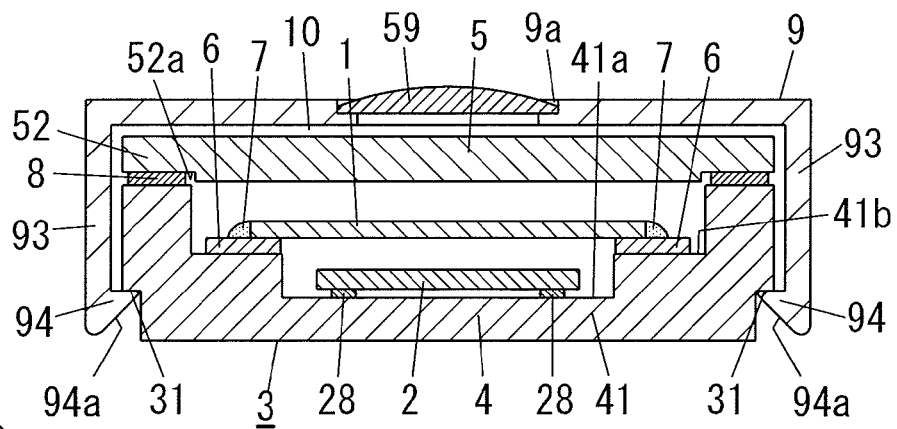

INFRARED SENSOR

TECHNICAL FIELD

The present invention relates to infrared sensors.

BACKGROUND ART

Conventionally, as shown in FIG. 12, proposed is an infrared sensor which houses, in a can package 130, a pyroelectric element 101, an IC device 102 in which most of the signal processing circuit that signal-processes an output current of the pyroelectric element 101 is integrated onto one chip, and a three-dimensional circuit block 120 made from an MID (Molded Interconnect Devices) substrate mounted with a capacitor (not shown) and the like attached outside the IC device 102 (for example, refer to Japanese Patent Publication No. 3367876; hereinafter referred to as "Patent Document 1"). Here, with the MID substrate configuring the three-dimensional circuit block 120, a circuit pattern 122 is formed on a surface of a resin molding 121. Moreover, the can package 130 is configured from a metal stem 131, and a metal cap 132 having an optical filter window 132a. Moreover, with the infrared sensor shown in FIG. 12, a dome-shaped condenser lens 150 is mounted outside the can package 130.

Moreover, conventionally, in an infrared sensor which houses, in a can package, a pyroelectric element and an IC device (signal processing IC) which processes an output signal of the pyroelectric element, it is known that the sensitivity will deteriorate when the signal input terminal and the signal output terminal of the IC device are subject to capacitive coupling (for example, refer to Japanese Patent Publication No. 4258139; hereinafter referred to as "Patent Document 2"). Here, foregoing Patent Document 2 discloses an infrared sensor in which, as shown in FIG. 13 and FIG. 14, a pyroelectric element 201 is mounted on an upper face part of a simultaneously-formed molding 210 in which first to seventh metal members 211 to 217 are insert-molded, an IC device 202 is mounted on a front face part of the simultaneously-formed molding 210, and an external capacitor C1 is mounted on a side face part of the simultaneously-formed molding 210. In addition, with this infrared sensor, in order to reduce the foregoing capacitive coupling, the fourth metal member 214 is bent as a metal member that is used exclusively for shielding, and the first metal member 211 for internal wiring that is connected to a signal input terminal and the sixth metal member 216 for external wiring that is connected to a signal output terminal are disposed in a diagonal direction relative to the simultaneously-formed molding 210. Moreover, the package 230 of this infrared sensor is configured from a metal stem (metal base) 231 mounted with the simultaneously-formed molding 210, and a metal cap 232, and a cap 232 is provided with an infrared transmission filter 233.

The IC device 102 disclosed in foregoing Patent Document 1 comprises, for example, a current-voltage conversion circuit, a voltage amplifier circuit, and an output circuit. The current-voltage conversion circuit comprises an operating amplifier in which a feedback capacity (capacitor) is connected between an inverting input port and an output port and a reference voltage is supplied from a non-inverting input port to a power circuit. A pyroelectric element is connected to the inverting input port of the operating amplifier so as to input pyroelectric current, and a small pyroelectric current is converted into a voltage signal of roughly several 10 µV based on the impedance conversion of the capacitor. With this current-voltage conversion circuit, it is possible to attenuate the impact of thermal noise, which is considered the dominant factor in a conventional current-voltage conversion circuit made of an impedance conversion circuit using a field-effect transistor and resistance of a high resistance value, considerably improve the S/N ratio, and thereby reduce noise and improve the sensitivity.

Nevertheless, with the infrared sensor configured as shown in FIG. 12, it is difficult to achieve a thin profile (low profile) since the three-dimensional circuit block 120 is housed in the can package 130, and, furthermore, surface mounting is not possible when the infrared sensor is to be secondarily mounted on a circuit board such as a printed-wiring board. Moreover, also with the infrared sensor configured as shown in FIG. 13, it is difficult to achieve a thin profile (low profile) since the simultaneously-formed molding 210 is housed in the can package 230, and, furthermore, surface mounting is not possible when the infrared sensor is to be secondarily mounted on a circuit board such as a printed-wiring board.

Meanwhile, proposed is an infrared sensor comprising, as shown in FIG. 15 and FIG. 16, a surface-mounted package 303 which houses an infrared sensor element 301, a field-effect transistor 302, a bypass capacitor (not shown), a resistor (not shown) having a high resistance value and the like, and an optical filter 304 mounted on an opening 303b of the package 303 (for example, refer to International Publication No. 2006/120863; hereinafter referred to as "Patent Document 3").

With the infrared sensor disclosed in foregoing Patent Document 3, the package 303 is formed in a rectangular box shape in which one face thereof is open, and a plurality of bases 312 for supporting the infrared sensor element 301 are disposed on an inner bottom face of the package 303. In addition, the field-effect transistor 302, the bypass capacitor, the resistor and the like are arranged in parallel to the infrared sensor element 301. Moreover, the planar shape of the optical filter 304 is a rectangular shape which substantially corresponds to the opening 303b of the package 303. Specifically, the planar size of the optical filter 304 is set so as to form a gap between the side edge of the optical filter 304 and an inner side face of the package 303, and the optical filter 304 is supported by supports 320 that are respectively disposed at the four corners of the opening 303b of the package 303. In addition, the optical filter 304 and the metal package body 303a of the package 303 are bonded by a conductive adhesive and thereby electrically connected.

Meanwhile, with the infrared sensor configured as shown in FIG. 15 and FIG. 16, there is a limit to the improvement of the S/N ratio since the thermal noise that is generated by the resistor having a high resistance value will increase. Thus, in order to achieve high sensitivity, considered may be using an IC device 102 (refer to FIG. 12) or an IC device 202 (refer to FIG. 13), which can amplifying the weak output signal of the infrared sensor element 301 with a high gain, in substitute for the field-effect transistor 302, the bypass capacitor, the resistor and the like.

Nevertheless, in the foregoing case, since the infrared sensor element 301 and the IC device 102 or the IC device 202 need to be arranged in parallel next to each other in the package 303, it is difficult to achieve downsizing and cost reduction. Moreover, in the foregoing case, the sensitivity will deteriorate due to the capacitive coupling of the infrared sensor element 301 and the output wiring connected to the IC device 102, 202.

DISCLOSURE OF INVENTION

Problems to be Solved by the Invention

In view of the above insufficiency, the present invention has been aimed to propose an infrared sensor which can be downsized and inhibit the deterioration of sensitivity caused by the capacitive coupling of the pyroelectric element and the output wiring connected to the IC device.

Means for Solving the Problems

The infrared sensor in accordance with the present invention includes a pyroelectric element, an IC device, and a surface-mounted package. The IC device is configured to process an output signal of the pyroelectric element. The package is configured to house the pyroelectric element and the IC device. The package includes a package body and a package lid. The package body includes a substrate made of a dielectric material, a circuit wiring, and a plurality of external connection electrodes. The circuit wiring and the plurality of the external connection electrodes are made of a metal material and formed on the substrate. The package lid is configured to transmit infrared rays to be detected by the pyroelectric element. The package lid is bonded to the package body in a manner of enclosing with the package body the pyroelectric element and the IC device. The package body is provided in its surface with plural recessed parts arranged in tiers. The IC device is mounted on a bottom of a lower recessed part of the recessed parts. The pyroelectric element is mounted on a bottom of an upper recessed part of the recessed parts closer to the surface of the package body than the lower recessed part is, so as to extend across the lower recessed part and to be away from the IC device in a thickness direction thereof. The package body includes an output wiring and a shielding member. The output wiring is configured to electrically connect an output terminal of the IC device to the external connection terminal. The shielding member is interposed between the pyroelectric element and the output wiring. The IC device includes a specific part adapted in use to receive a ground potential or a constant potential. The shielding member is electrically connected to the specific part of the IC device.

Preferably, in the present infrared sensor, the shielding member includes a shield layer embedded in the substrate of the package body and positioned between the pyroelectric element and the output wiring. The shield layer is electrically connected to the specific part of the IC device adapted in use to receive the ground potential or the constant potential.

Preferably, in the present infrared sensor, the shielding member includes a shield layer formed on an inner face of the substrate of the package body and positioned between the pyroelectric element and the output wiring. The shield layer is electrically connected to the specific part of the IC device adapted in use to receive the ground potential or the constant potential.

Preferably, in the present infrared sensor, the shielding member includes a shield layer positioned between the pyroelectric element and the output wiring, the shield layer including one part embedded in the substrate of the package body and a remaining part formed on an inner face of the substrate. The shield layer is electrically connected to the specific part of the IC device adapted in use to receive the ground potential or the constant potential.

Preferably, in the present infrared sensor, the IC device has a main surface provided with a circuit part and a rear surface opposite to the main surface. The IC device is mounted on the bottom of the lower recessed part such that the main surface and the rear surface face the bottom of the lower recessed part and the pyroelectric element, respectively.

Preferably, in the present infrared sensor, the shielding member includes a shield layer provided to the rear surface of the IC device and positioned between the pyroelectric element and the output wiring. The shield layer is electrically connected to the specific part of the IC device adapted in use to receive the ground potential or the constant potential.

Preferably, in the present infrared sensor, the shielding member includes a shield plate interposed between the rear surface of the IC device and the pyroelectric element so as to be interposed between the pyroelectric element and the output wiring. The shield plate is electrically connected to the specific part of the IC device adapted in use to receive the ground potential or the constant potential.

Preferably, in the present infrared sensor, the shield plate is made of a metal plate or a printed board.

Preferably, in the present infrared sensor, an outer shape of the package body is a square shape in a planar view. The center of the pyroelectric element is aligned with a center of the package body in the planar view.

Preferably, in the present infrared sensor, the package lid is provided at its periphery with a stepped part for positioning the package lid relative to the package body.

Preferably, in the present infrared sensor, the package lid is a silicon lens.

Preferably, the present infrared sensor includes a plastic housing disposed outside the package.

Preferably, in the present infrared sensor, the housing is mounted on the package in a manner of forming with the package an air space, excluding a part used for attaching the housing to the package.

Preferably, in the present infrared sensor, the housing is mounted on the package by engaging an engaging recessed part provided to a side face of the package body and an engaging protruded part provided to the housing.

Preferably, in the present infrared sensor, the pyroelectric element is made of a pyroelectric material selected from lithium tantalate and lithium niobate.

BRIEF DESCRIPTION OF DRAWINGS

FIG. 11 is a schematic cross section illustrating the infrared sensor of Embodiment 4.

BEST MODE FOR CARRYING OUT THE INVENTION

Embodiment 1

Figure 1:
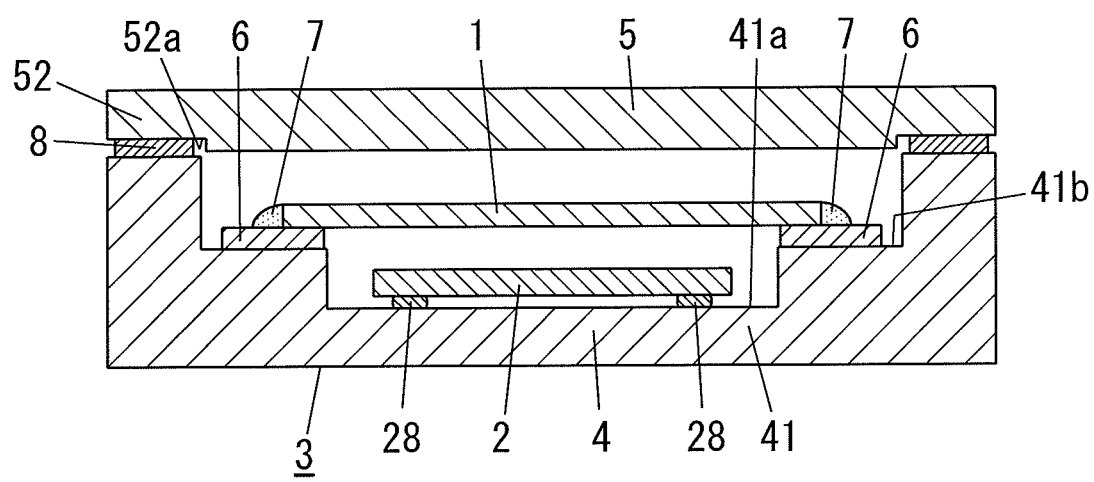
FIG. 1 is a schematic cross section illustrating the infrared sensor of Embodiment 1.

The infrared sensor of the present embodiment is now explained with reference to FIG. 1 to FIG. 4.

The infrared sensor of the present embodiment includes a pyroelectric element 1 as a thermal infrared detection element, an IC device 2 configured to process an output signal of the pyroelectric element 1, and a surface-mounted package 3 configured to house the pyroelectric element 1 and the IC device 2.

Here, the package 3 includes a package body 4, and a package lid 5. The package lid 5 is bonded to the package body 4 in a manner of enclosing the pyroelectric element 1 and the IC device 2 with the package body 4. The package body 4 includes a substrate 41, a circuit wiring (not shown), and a plurality of external connection electrodes 45 (refer to FIG. 4). The substrate 41 is made of a dielectric material (e.g., ceramics). The circuit wiring and the external connection electrodes 45 are made of a metal material and are formed on the substrate 41. The package lid 5 is configured to transmit infrared rays to be detected by the pyroelectric element 1. The package lid 5 has electrical conductivity. Moreover, the package body 4 is provided with a shield part 43 (refer to FIG. 4). The shield part 43 is configured to prevent external electromagnetic noise to a sensor circuit 100 (refer to FIG. 3). The sensor circuit 100 includes the pyroelectric element 1 and the IC device 2 and the foregoing circuit wiring. The package lid 5 is electrically connected to the shield part 43 of the package body 4. Note that, in this embodiment, although the airtight space enclosed by the package body 4 and the package lid 5 is filled with dry nitrogen (dry nitrogen atmosphere), it is not limited thereto, and, for example, it may also be a vacuum (a vacuum atmosphere) or be filled with air (an air atmosphere).

Figure 2:
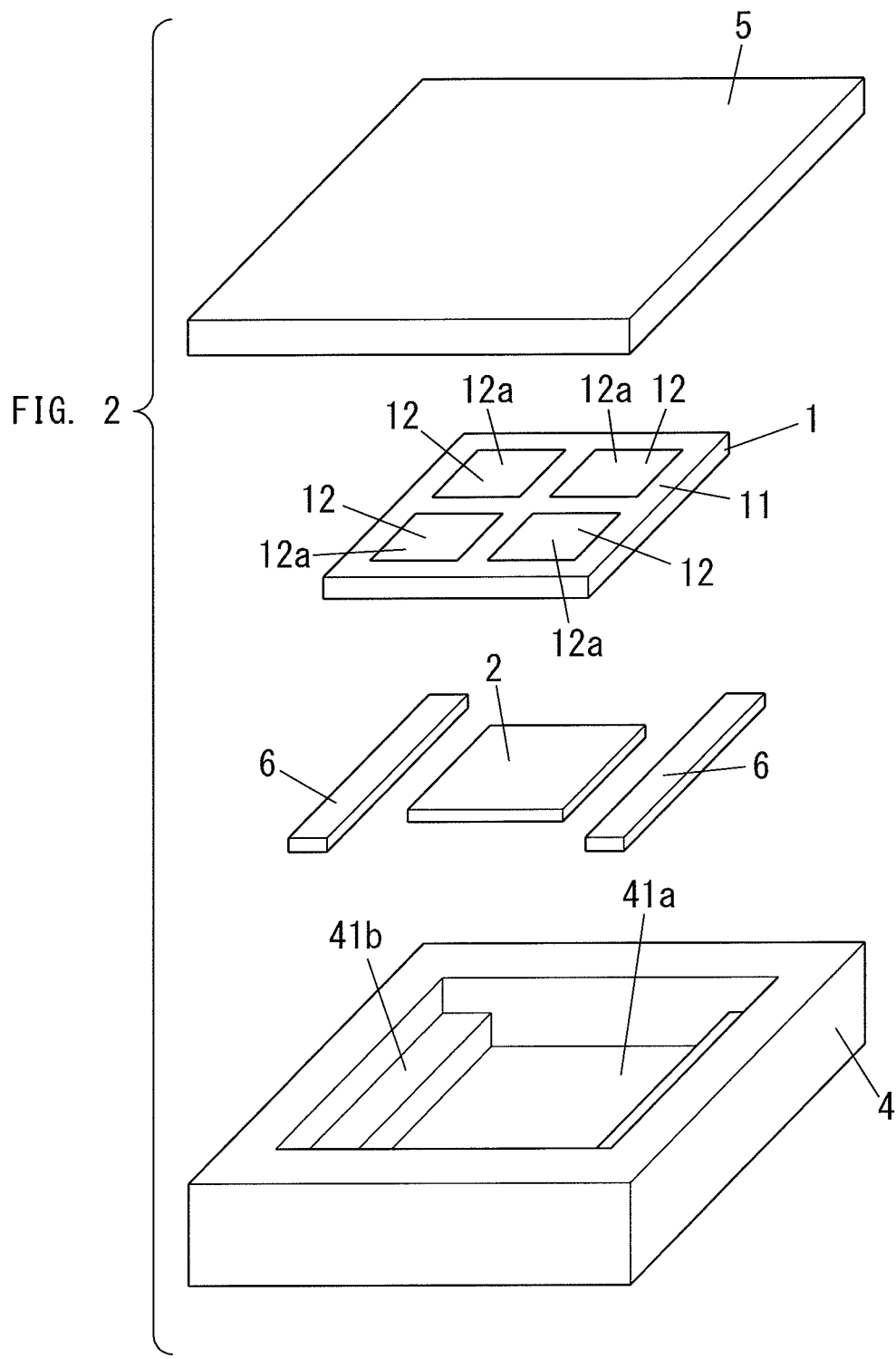
FIG. 2 is a schematic exploded perspective view illustrating the foregoing infrared sensor.

The pyroelectric element 1 is a quad-type element, and, as shown in FIG. 2, four light-receiving parts (device element) 12 are formed in a 2 by 2 array on a single pyroelectric substrate 11. Here, the respective light-receiving parts 12 are constituted by a pair of square electrodes 12a formed in a manner of being placed opposite each other on either face in the thickness direction of the pyroelectric substrate 11, and a portion interposed between the pair of electrodes 12a within the pyroelectric substrate 11. Moreover, the pyroelectric element 1 is structured such that, by forming a U-shaped slit (not shown) in a planar view along the three sides of the square electrode 12a in a planar view in the rectangular pyroelectric substrate 11, the respective device elements 12 are cantilevered and supported by a part of the pyroelectric substrate 11. As a result of forming this kind of slit, it is possible to improve the sensitivity and reduce popcorn noise (for example, refer to Japanese Patent Publication No. 3372180). Note that the electrode 12a is made of an infrared absorbing material (for example, NiCr or the like).

With the foregoing pyroelectric element 1, the electrode 12a of the respective light-receiving parts 12 is disposed so that the center of the light-receiving part 12 is positioned at the corner of a virtual square more on the inner side than the outer peripheral line of the pyroelectric substrate 11 at the center part of the pyroelectric substrate 11. Moreover, with the pyroelectric element 1, an output terminal portion (not shown) is formed at both ends of the pyroelectric substrate 11. Based on a wiring pattern (not shown) or the like formed on either face in the thickness direction of the pyroelectric substrate 11, the two light-receiving parts 12 positioned orthogonally among the four light-receiving parts 12 are connected in parallel, and the two light-receiving parts 12 positioned at mutually different opposing corners are connected in antiparallel. Consequently, with this pyroelectric element 1, the load generated in the two light-receiving parts 12 due to changes in the environmental temperature or the like is set off by the light-receiving parts 12 that are connected in antiparallel. Therefore, the S/N ratio can be improved.

Note that the pyroelectric element 1 is not limited to the quad-type element of FIG. 2, and, for example, it may also be a dual-type element in which two light-receiving parts 12 are formed in a 1 by 2 array, or a quad-type element in which four light-receiving parts 12 are formed in a 1 by 4 array.

However, the pyroelectric element 1 configured as shown in FIG. 2 can reduce the fluctuation of the output of the pyroelectric element 1 caused by external heat in comparison to a dual-type element or a quad-type element in which the light-receiving parts 12 are formed in a 1 by 4 array.

Moreover, in the present embodiment, a lead-free solder (for example, SnCuAg solder or the like) can be used as a bonding material for secondarily mounting the infrared sensor on a circuit board such as a printed-wiring board. However, when a PZT (: Pb(Zr, Ti)O$_3$)-based material is adopted as the pyroelectric material of the pyroelectric substrate 11 of the pyroelectric element 1, the Curie temperature can be raised to be higher than the peak flow temperature (260° C.) by arbitrarily selecting the composition or additive of the PZT. Nevertheless, since the temperature difference between the Curie temperature and the peak flow temperature is small, unless the peak flow temperature is managed with high precision, there is concern that the peak flow temperature will exceed the Curie temperature of the pyroelectric element 1, whereby the polarization of the pyroelectric element 1 will be lost and the pyroelectric effect cannot be obtained.

Thus, as the pyroelectric material of the pyroelectric substrate 11 of the pyroelectric element 1, preferably used is lithium tantalate (: LiTaO$_3$) or lithium niobate (: LiNbO$_3$) having higher thermal resistance than PZT as a result of having a higher Curie temperature than the PZT. As a result of using lithium tantalate or lithium niobate having a higher Curie temperature than the PZT as the pyroelectric material, in the secondary mounting via a lead-free solder, the reflow temperature can be managed easily, and it is also possible to reliably prevent the deterioration in the characteristics of the pyroelectric element 1 even in cases where the peak flow temperature changes (overshoots) to the high temperature side that is higher than the intended preset temperature (260° C.). Thus, it is possible to increase cost reduction and reliability based on the improvement in the yield of the secondary mounting process. Note that the Curie temperature of lithium tantalate is roughly 618° C. and the Curie temperature of lithium niobate is roughly 1140° C., and these are temperatures that are more than twice as high as the reflow peak temperature.

Figure 3:
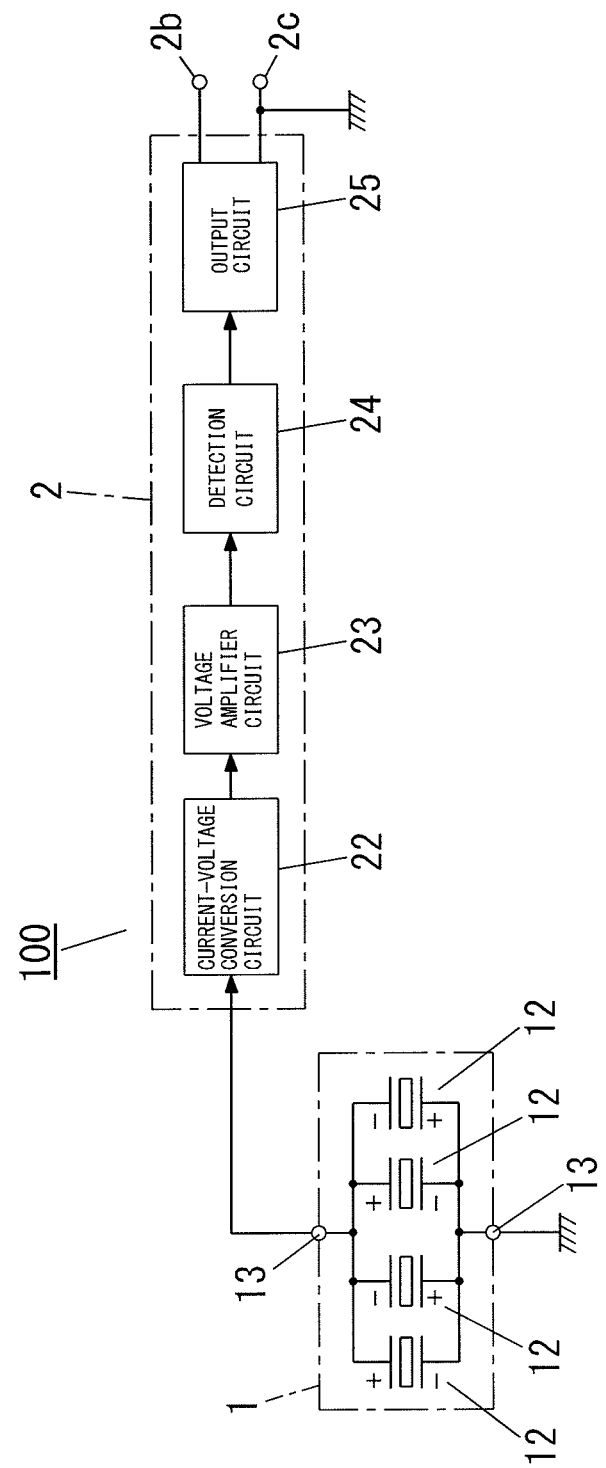
FIG. 3 is a circuit block diagram illustrating the foregoing infrared sensor.
Figure 4:
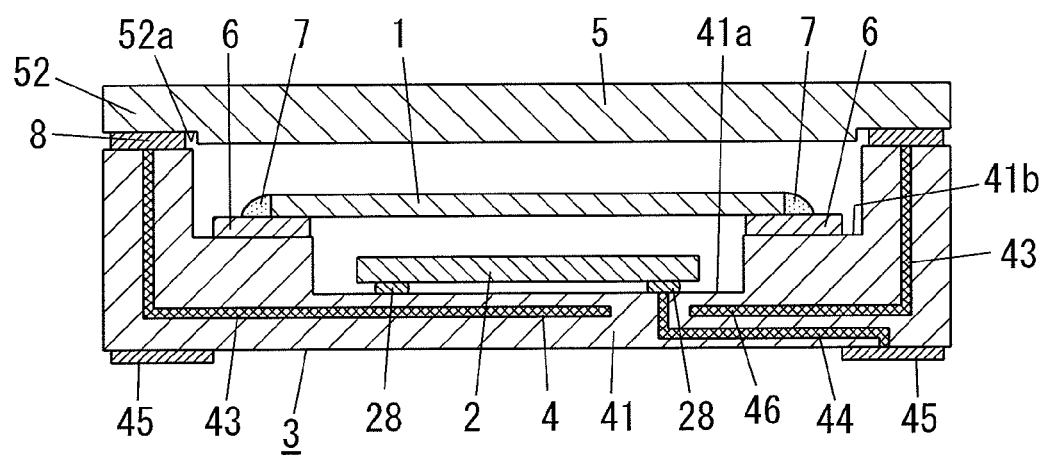
FIG. 4 is a schematic cross section illustrating the foregoing infrared sensor.

Moreover, the IC device 2, as shown in FIG. 3, includes a current-voltage conversion circuit 22, a voltage amplifier circuit 23, a detection circuit 24, and an output circuit 25. The current-voltage conversion circuit 22, the voltage amplifier circuit 23, the detection circuit 24, and the output circuit 25 are formed as a single chip. The current-voltage conversion circuit 22 is configured to convert a pyroelectric current, which is an output signal that is output from the pyroelectric element 1, into a voltage signal. The voltage amplifier circuit 23 is configured to amplify a voltage signal with a predetermined frequency band of the voltage signal obtained from the current-voltage conversion circuit 22. The detection circuit 24 is configured to compare the voltage signal amplified by the voltage amplifier circuit 23 with an arbitrarily set threshold. The detection circuit 24 is configured to, upon acknowledging that the voltage signal exceeds the threshold, output a detection signal. The output circuit 25 is configured to output the detection signal of the detection circuit 24 as a predetermined human detection signal. Here, the current-voltage conversion circuit 22 includes an operating amplifier added with a feedback capacity (capacitor), and a DC feedback circuit which feeds back the output of the operating amplifier to the input side, and is used for converting a small pyroelectric current to a voltage signal of roughly several 10 µV based on the impedance of the feedback capacity. Thus, it is possible to increase the gain, improve the S/N ratio and achieve higher sensitivity in comparison to a current-voltage conversion circuit that uses a field-effect transistor and a resistor connected to the gate of the field-effect transistor. Note that the basic circuit configuration of the IC device 2 comprising this type of current-voltage conversion circuit 22 and voltage amplifier circuit 23 is disclosed in foregoing Patent Document 1 and well known, and, therefore, the detailed explanation thereof is omitted. Moreover, the basic circuit configuration of the IC device 2 may also be the configuration disclosed in foregoing Patent Document 2. Moreover, the IC device 2 may also be configured to process the output voltage as the output signal of the pyroelectric element 1.

Meanwhile, in the present embodiment, as a result of adopting an inorganic material such as ceramics or glass as the electric insulating material of the substrate 41 of the package body 4, in comparison to cases of adopting an organic material such as epoxy resin as the foregoing electric insulating material, it is possible to prevent the deterioration in the insulating resistance between the foregoing circuit wiring caused by the absorption of moisture by the package body 4, and additionally improve the thermal resistance. Here, if alumina is adopted as the foregoing inorganic material, in comparison to cases of adopting aluminum nitride, silicon carbide or the like as the foregoing inorganic material, the thermal conductivity of the foregoing insulating material can be reduced, and it is possible to inhibit the deterioration in the sensitivity of the pyroelectric element 1 caused by the fluctuation of outside heat.

Meanwhile, the package body 4 is provided with plural (two, in the present embodiment) recessed parts 41a and 41b arranged in tiers in a surface of the package body 4. The IC device 2 is mounted on a bottom of the lower recessed part 41a. The pyroelectric element 1 is mounted, in a planar view of the package body 4, on a bottom of the upper recessed part 41b closer to the surface of the package body 4 than the lower recessed part 41a is, so as to extend across the lower recessed part 41a and to be away from the IC device 2 in a thickness direction of the package body 4. Note that the number of the foregoing concave parts (41a, 41b) provided to the surface of the package body 4 is not limited to two, and will suffice so as long as it is plural. Thus, it will suffice so as long as the IC device 2 is mounted on the bottom of the relatively lower recessed part 41a and the pyroelectric element 1 is mounted on the bottom of the relatively upper recessed part 41b.

Here, the IC device 2 has a main surface provided with a circuit part and a rear surface opposite to the main surface. The IC device 2 is mounted on the bottom of the lower recessed concave part 41a such that the main surface and the rear surface face the bottom of the lower recessed part 41a and the pyroelectric element 1, respectively. In other words, the IC device 2 is a bare chip, and is mounted, via flip-chip mounting, on the package body 4 with a plurality of bumps (for example, Au ball bumps, Au plated bumps, Cu balls subject to Au plating using the C4 technique, solder bumps and the like) 28 interposed therebetween.

Moreover, with respect to the package body 4, two conductive supports 6 configured to support the pyroelectric element 1 are fixed to the bottom of the upper recessed part 41b. Here, the two output terminal portions of the pyroelectric element 1 are electrically connected to the respective conductive supports 6. The respective conductive supports 6 are formed in a strip shape, and are disposed on the bottom of the upper recessed part 41b such that one side faces thereof along the longitudinal direction face each other. Moreover, the pyroelectric element 1 is disposed so that the output terminal portions are overlapped with the respective conductive supports 6, and the light-receiving parts 12 are not overlapped with the conductive supports 6. In other words, in this embodiment, since the pyroelectric element 1 is supported by two conductive supports 6 on either side, the pyroelectric element 1 can be stably supported. Moreover, the respective conductive supports 6 and the package body 4 are bonded via an adhesive (for example, epoxy resin or the like) having electrical insulation and thermal insulation properties. Consequently, it is possible to improve the thermal insulation properties between the conductive support 6 and the package body 4, and improve the thermal insulation properties between the pyroelectric element 1 and the package body 4. Note that the conductive support 6 does not necessarily have to be a separate member from the package body 4, and it may also be formed integrally with the package body 4. In addition, by providing a land to the package body 4 for connecting to the pyroelectric element 1, it is possible to omit the conductive support 6 and directly mount the pyroelectric element 1 on the package body 4.

With regard to the foregoing conductive support 6, a gold plating film, a silver plating film or a nickel plating film is formed on a surface of a conductive plate made of copper or iron. Here, the output terminal portions are electrically connected to the respective conductive supports 6 via respective bond parts 7 made of an organic resin-based conductive adhesive. Consequently, it is possible to inhibit the thermal conduction from the conductive support 6 to the pyroelectric element 1.

Moreover, the package body 4 is provided with the foregoing shield part 43 made of a metal material (for example, Cu or the like). The output terminal portion of the pyroelectric element adapted in use to be grounded as well as the output terminal 2c (refer to FIG. 3) of the IC device 2 adapted in used to be grounded are appropriately connected to the shield part 43 of the package body 4. Moreover, the output terminal 2b (refer to FIG. 3) for signal outputs of the IC device 2 is electrically connected to the external connection electrode 45 via the foregoing bump 28 and the output wiring 44 of the package body 4. Preferably, the output wiring 44 is provided at a position that is separated from the pyroelectric element 1 as much as possible.

Meanwhile, with regard to the infrared sensor of this embodiment, a shielding member is interposed between the pyroelectric element 1 and the output wiring 44 connected to the IC device 2. The shielding member is electrically connected to a specific part of the IC device 2 adapted in use to receive a ground potential. Here, the shielding member in the present embodiment comprises a shield layer 46 embedded in the substrate 41 of the package body 4 and positioned between the pyroelectric element 1 and the output wiring 44.

Figure 5:
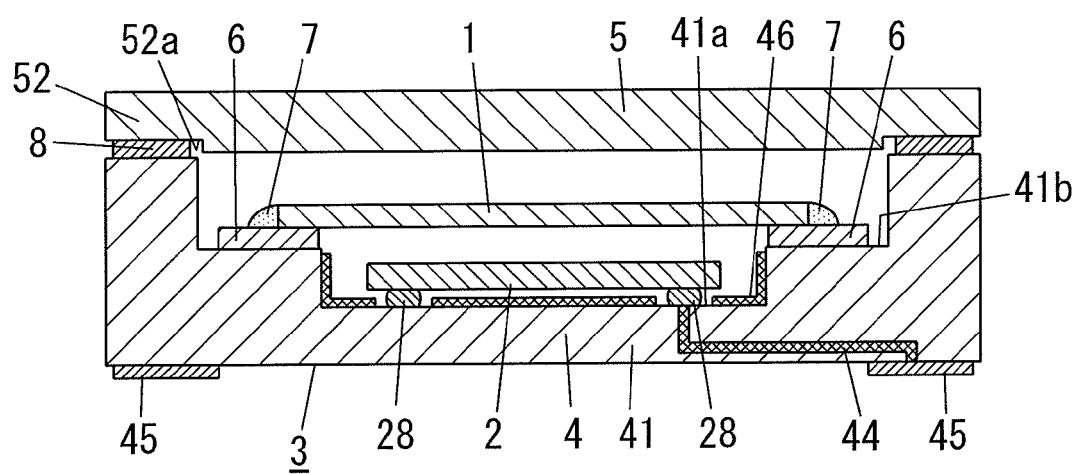
FIG. 5 is a schematic cross section illustrating another configuration example of the foregoing infrared sensor.
Figure 6:
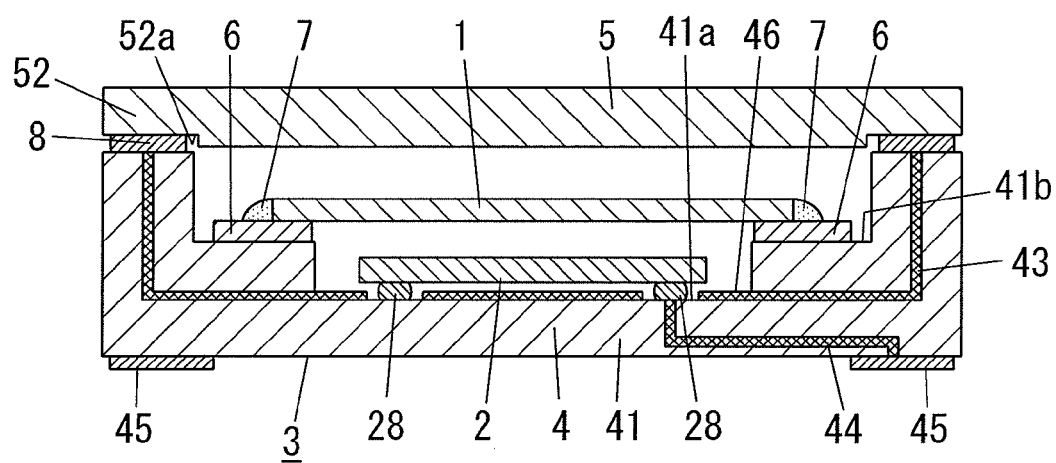
FIG. 6 is a schematic cross section illustrating another configuration example of the foregoing infrared sensor.

The shield layer 46 is electrically connected to the specific part of the IC device 2 adapted in use to receive the ground potential. The shield layer 46 interposed between the pyroelectric element 1 and the output wiring 44 is not limited to being embedded in the substrate 41. As shown in FIG. 5, the shield layer 46 may also be formed on an inner face of the substrate 41. Moreover, as shown in FIG. 6, the shield layer 46 may include one part embedded in the substrate 41 and a remaining part other than such part formed on the inner face of the substrate 41. In the respective instances of FIG. 5 and FIG. 6, the shield layer 46 formed on the inner face of the substrate 41 may be electrically connected to the specific part of the IC device 2 via a bump or a bonding wire. The specific part is adapted in use to receive the ground potential.

With regard to the infrared sensor of the present embodiment, the external connection electrode (not shown) for grounding that is electrically connected to the shield part 43 is also provided to the outer bottom face of the package body 4. Thus, by electrically connecting the external connection electrode for grounding to a ground pattern of such as a circuit board on which the infrared sensor is secondarily mounted, it is possible to reduce the influence of the external electromagnetic noise to the sensor circuit 100 constituted by the pyroelectric element 1, the IC device 2 and the like, and prevent the deterioration of the S/N ratio caused by the external electromagnetic noise.

In the present embodiment, since the shield layer 46 and the shield part 43 are electrically connected and have the same potential, the shield layer 46 is electrically connected to the specific part (ground terminal or the like) of the IC device 2 adapted in use to receive the ground potential. However, when the shield layer 46 and the shield part 43 are electrically insulated, the shield layer 46 may be electrically connected to a specific part of the IC device 2 adapted in use to receive a constant potential (constant potential circuit or the like to receive the constant potential). As the electrical connection means in the foregoing case, for instance, bumps or bonding wires may be used according to the mounting mode of the IC device 2.

The shield part 43 in the present embodiment is formed in a manner of extending from a bottom wall to a side wall of the substrate 41 of the package body 4, and can increase the shield effect in comparison to an instance where the shield layer 43 is formed only in the bottom wall or the side wall. Here, the shield part 43 is embedded in the substrate 41 of the package body 4, and is not exposed to the inner face of the package body 4. Accordingly, with the infrared sensor of the present embodiment, it is possible to prevent the interference of the shield part 43 and the sensor circuit 100 in the package 3.

Moreover, the foregoing shield part 43 may be constituted by a plurality of conductive via holes embedded in the side wall of the package body 4 along the height direction of that side wall, and a conductive layer that is embedded in the bottom wall of the package body 4 and which electrically connects the plurality of conductive via holes. Here, if these plurality of conductive via holes are arranged so as to enclose the inner space of the package body 4 and one end face on the side of the package lid 5 in the respective conductive via holes is exposed, it is possible to electrically connect the respective conductive via holes and the package lid 5, and to reduce the electrical resistance between the package lid 5 and the external connection electrode for grounding to be electrically connected to the package lid 5, and increase the shield effect against external electromagnetic noise. In either case, with the present embodiment, since the shield part 43 is extended up to an apical surface of the side wall of the package body 4, the package lid 5 and the shield part 43 can be electrically connected by bonding the package lid 5 to the package body 4 in a manner where the peripheral part of the package lid 5 is overlapped with the side wall of the package body 4.

Meanwhile, with regard to the infrared sensor of the present embodiment, the IC device 2 includes the current-voltage conversion circuit 22 and the voltage amplifier circuit 23. Therefore, it is possible to enhance the output signal of the IC device 2. Moreover, since the impedance of the pyroelectric element 1 itself is also extremely high at roughly 100 GΩ, the infrared sensor is susceptible to the influence of the external electromagnetic noise unless, as described above, the package lid 5 receives the ground potential or a specific potential (constant potential) by means of providing the shield part 43 to the package body 4 and electrically connecting the package lid 5 to the shield part 43 of the package body 4.

On the other hand, with the infrared sensor of the present embodiment, as described above, the package body 4 is provided with the shield part 43 for preventing external electromagnetic noise to the sensor circuit 100 including the pyroelectric element 1, the IC device 2, and the foregoing circuit wiring, and the package lid 5 is electrically connected to the shield part 43 of the package body 4. Consequently, it is possible to inhibit the deterioration of the sensitivity caused by the influence of external electromagnetic noise yet the package 3 can be made thin.

Moreover, the foregoing package lid 5 is an infrared optical filter including a silicon substrate and a filter part formed on one surface (lower surface, in FIG. 1) of the silicon substrate. The silicon substrate is one type of substrate having conductivity and properties of transmitting infrared rays. Here, the filter part is an optical multi-layered film (multi-layered interference filter film) configured to transmit infrared rays of a predetermined wavelength range and reflect infrared rays other than the foregoing wavelength range. Accordingly, with the infrared sensor of the present embodiment, the package lid 5 can cut the infrared rays and visible light of an unwanted wavelength range other than the intended wavelength range by using the filter part, and it is possible to prevent the generation of noise caused by solar light or the like, and thereby improve the sensitivity.

Note that a material of the substrate is not limited to silicon, and, for example, may also be germanium, gallium arsenide, zinc sulfate or the like.

Moreover, the package lid 5 has a peripheral part 52 overlapped with the side wall of the package body 4. The silicon substrate of the package lid 5 is exposed at the peripheral part 52. Accordingly, regardless of the filter part, the package lid 5 can be electrically connected to the shield part 43. Note that, with the package lid 5, the filter part can also be formed on the other surface without limitation to the foregoing one surface of the silicon substrate, and the filter part is preferably formed on at least one surface. Moreover, the filter part formed on the foregoing one surface and the filter part formed on the foregoing other surface may mutually have the same filter characteristics, but the unwanted infrared rays and visible light can be more effectively cut by causing the mutual filter characteristics to differ.

With the infrared sensor of the present embodiment, by bonding and electrically connecting the package lid 5 and the package body 4 via the bond part 8 (refer to FIG. 1) made from high-melting point solder or conductive resin, it is possible to enhance the electromagnetic shield effect of the overall infrared sensor.

With the infrared sensor of the present embodiment, a stepped part 52a for positioning the package lid 5 relative to the package body 4 is provided to the peripheral part 52 of the package lid 5, and the positioning accuracy of the package lid 5 relative to the package body 4 can be improved.

Moreover, even when the pyroelectric element 1 and the IC device 2 are spaced from each other in the thickness direction of the pyroelectric element 1, since the distance between the IC device 2 and the pyroelectric element 1 is shortened due to the downsizing of the package 3, a phenomenon (capacitive feedback) where an output signal of the output terminal (hereinafter referred to as the "signal output terminal") 2b for the signal output of the IC device 2 is fed back to the pyroelectric element 1 will occur, and there is concern of an erroneous detection caused by such capacitive feedback (since the sensitivity will change, erroneous detection or non-detection may occur).

On the other hand, with regard to the infrared sensor of the present embodiment, the IC device 2 is mounted on the package body 4 with flip-chip bonding in such a manner that the circuit part on the main surface of the IC device 2 is far from the pyroelectric element 1. Consequently, with regard to the infrared sensor of the present embodiment, even in cases where the IC device 2 includes the voltage amplifier circuit 23 for amplifying the output voltage of the current-voltage conversion circuit 22 as described above, it is possible to prevent the erroneous detection caused by the capacitive coupling of the signal output terminal 2b of the IC device 2 and the pyroelectric element 1.

In relation to the infrared sensor of this embodiment explained above, since the shield part 43 for preventing external electromagnetic noise to the sensor circuit 100 that includes the pyroelectric element 1, the IC device 2, and the foregoing circuit wiring is formed in the package body 4, and since the package lid 5 is electrically connected to the shield part 43 of the package body 4, it is possible to inhibit the deterioration of the sensitivity caused by the influence of external electromagnetic noise yet the package 3 can be made thin.

Moreover, with regard to the infrared sensor of the present embodiment, the IC device 2 is mounted on the bottom of the lower recessed part 41a of the package body 4. The pyroelectric element 1 is mounted on the bottom of the upper recessed part 41b closer to the surface of the package body 4 than the lower recessed surface 41a is, so as to extend across the lower recessed part 41a in a planar view of the package body 4 and to be away from the IC device 2 in a thickness direction of the pyroelectric element 1. Therefore, it is possible to realize downsizing and cost reduction. In addition, with respect to the infrared sensor of the present embodiment, the shielding member is provided between the pyroelectric element 1 and the output wiring 44 which electrically connects the output terminal 2b of the IC device 2 and the external connection electrode 45. The shielding member is electrically connected with the specific portion adapted in use to receive the ground potential or the constant potential of the IC device 2. Therefore, it is possible to inhibit the deterioration of the sensitivity caused by the capacitive coupling of the pyroelectric element 1 and the output wiring 44 connected to the IC device 2.

Here, in relation to the infrared sensor of the present embodiment, the shielding member comprises the shield layer 46 embedded in the substrate 41 of the package body 4 and positioned between the pyroelectric element 1 and the output wiring 44. Consequently, the capacitive coupling of the pyroelectric element 1 and the output wiring 44 connected to the IC device 2 can be inhibited at a lowered cost. Moreover, in an alternative instance as shown in FIG. 6, the shielding member is defined by the shield layer 46 including one part embedded in the substrate 41 of the package body 4 and the remaining part formed on the inner face of the substrate 41. In another alternative instance as shown in FIG. 5, the shielding member is defined by the shield layer 46 formed on the inner face of the substrate 41 of the package body 4 and positioned between the pyroelectric element 1 and the output wiring 44. Even in these instances, the capacitive coupling of the pyroelectric element 1 and the output wiring 44 connected to the IC device 2 can be inhibited at a low cost. Moreover, in relation to the infrared sensor of the present embodiment, the pyroelectric element 1 and the IC device 2 are fixed to the package body 4 in such a manner that the pyroelectric element 1 and the IC device 2 are arranged next to each other in the thickness direction of the pyroelectric element 1. Accordingly, it is possible to achieve downsizing based on the reduction of the planar size of the package 3 in comparison to the case of arranging the pyroelectric element 1 and the IC device 2 horizontally. Further, it is possible to reduce a mounted area necessary to secondarily mount the infrared sensor on a circuit board.

Figure 12:
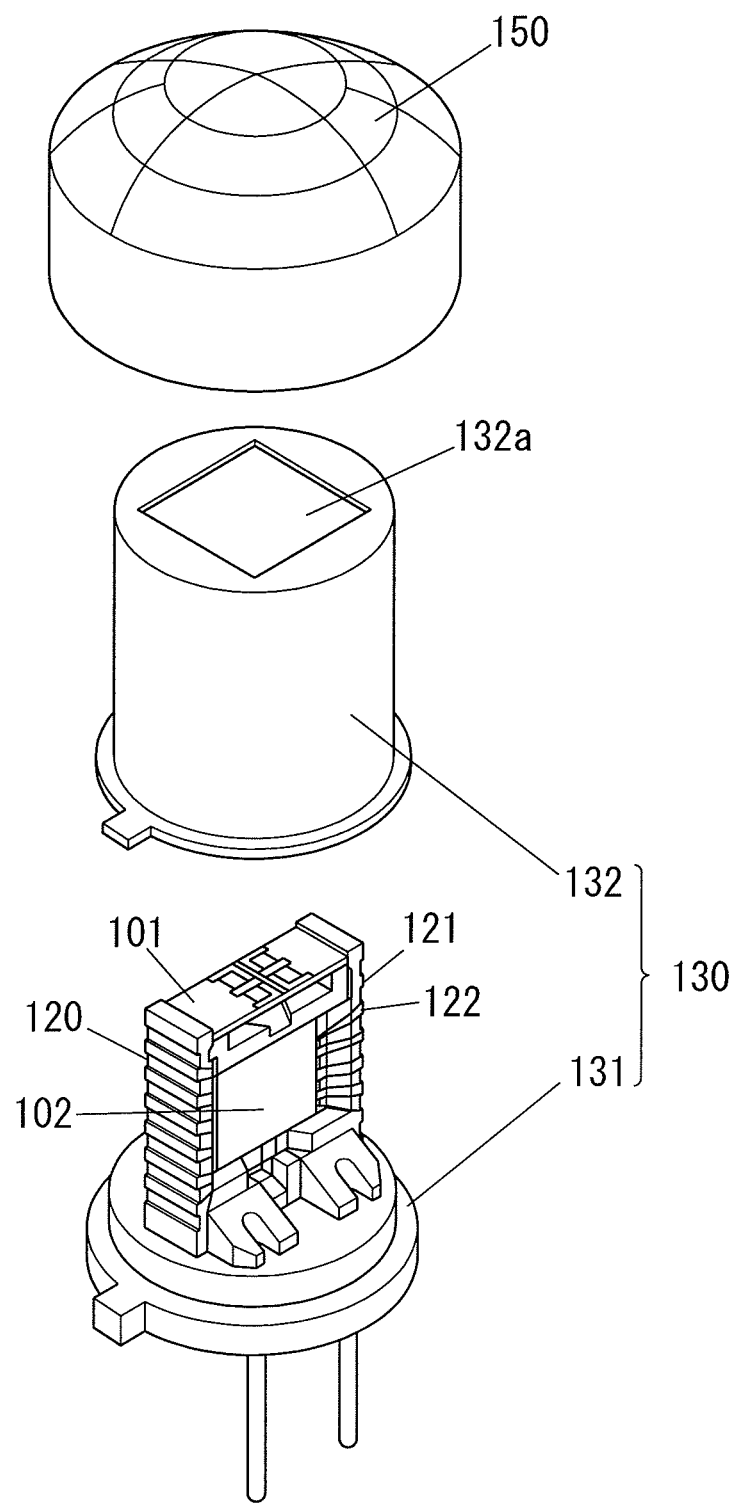
FIG. 12 is a schematic exploded perspective view illustrating the infrared sensor in accordance with a conventional example.
Figure 13:
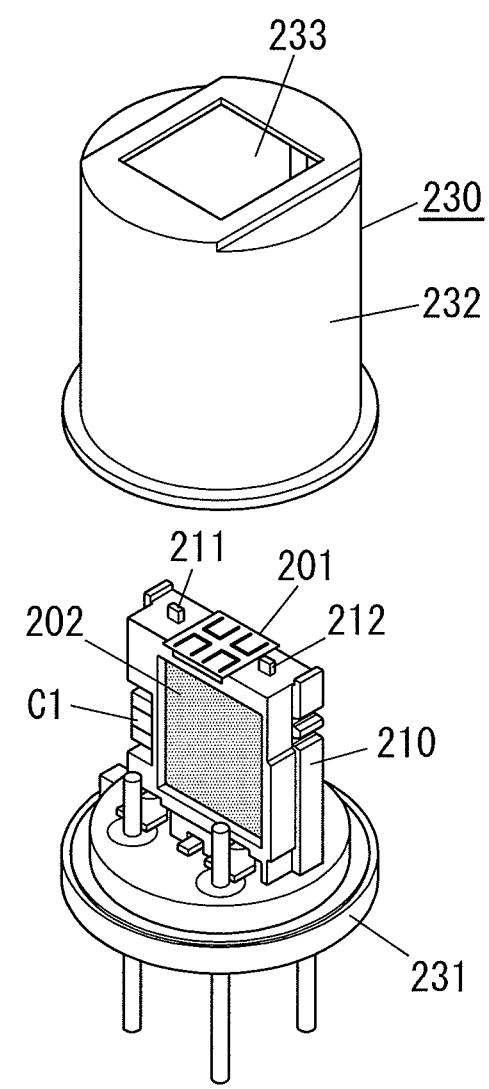
FIG. 13 is a schematic exploded perspective view illustrating the infrared sensor in accordance with another conventional example.
Figure 14:
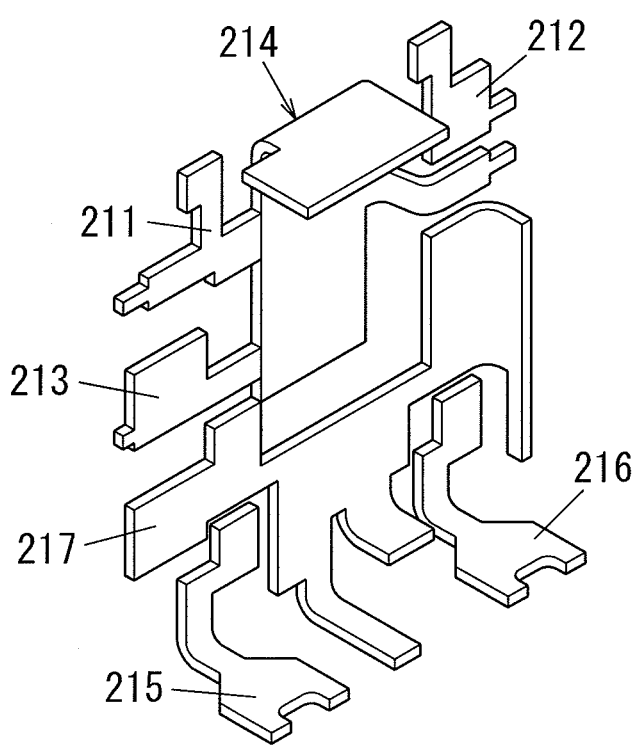
FIG. 14 is a schematic perspective view illustrating the first to seventh metal members used in the foregoing infrared sensor.
Figure 15:
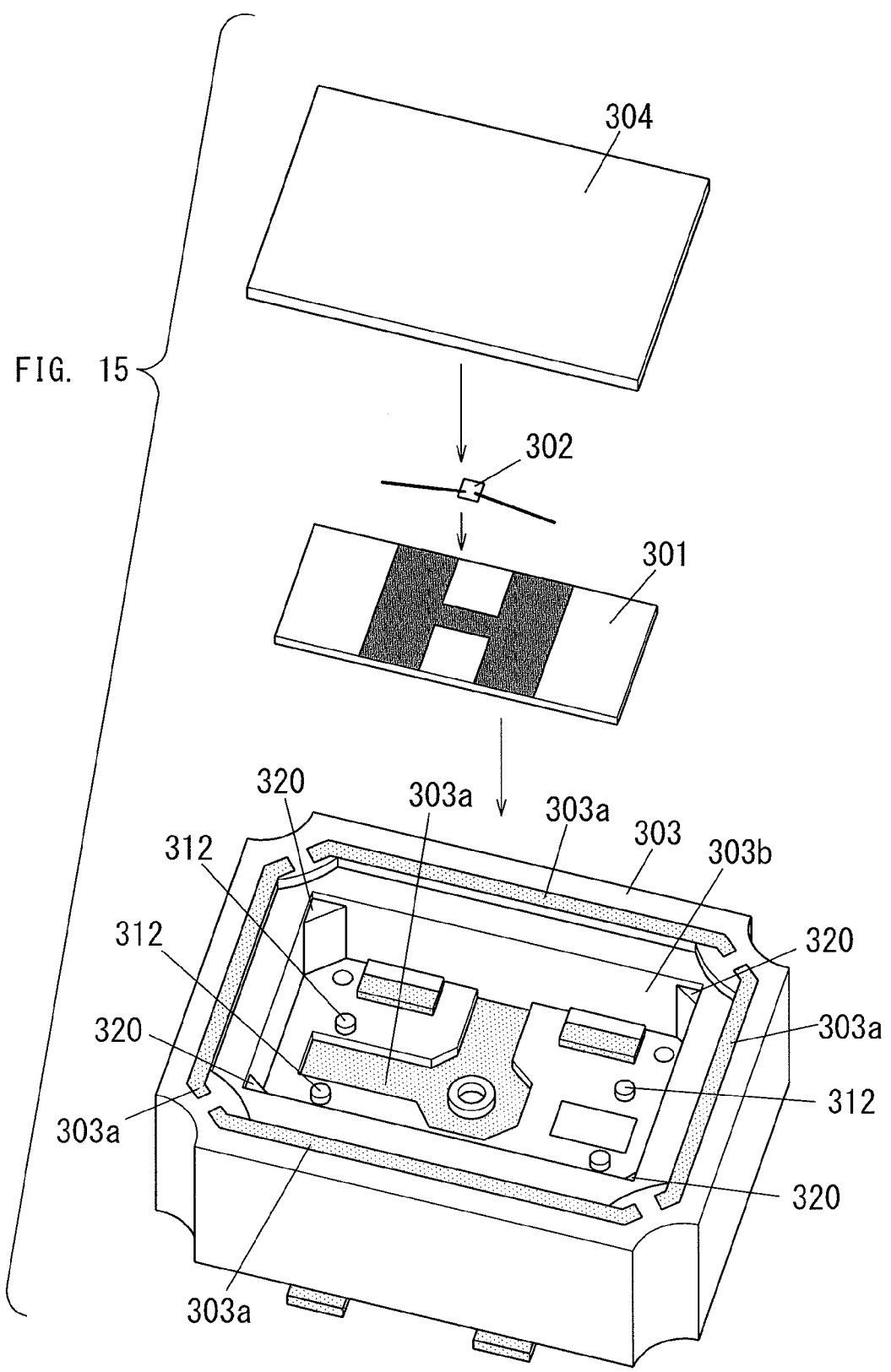
FIG. 15 is a schematic exploded perspective view illustrating the infrared sensor in accordance with another conventional example.
Figure 16:
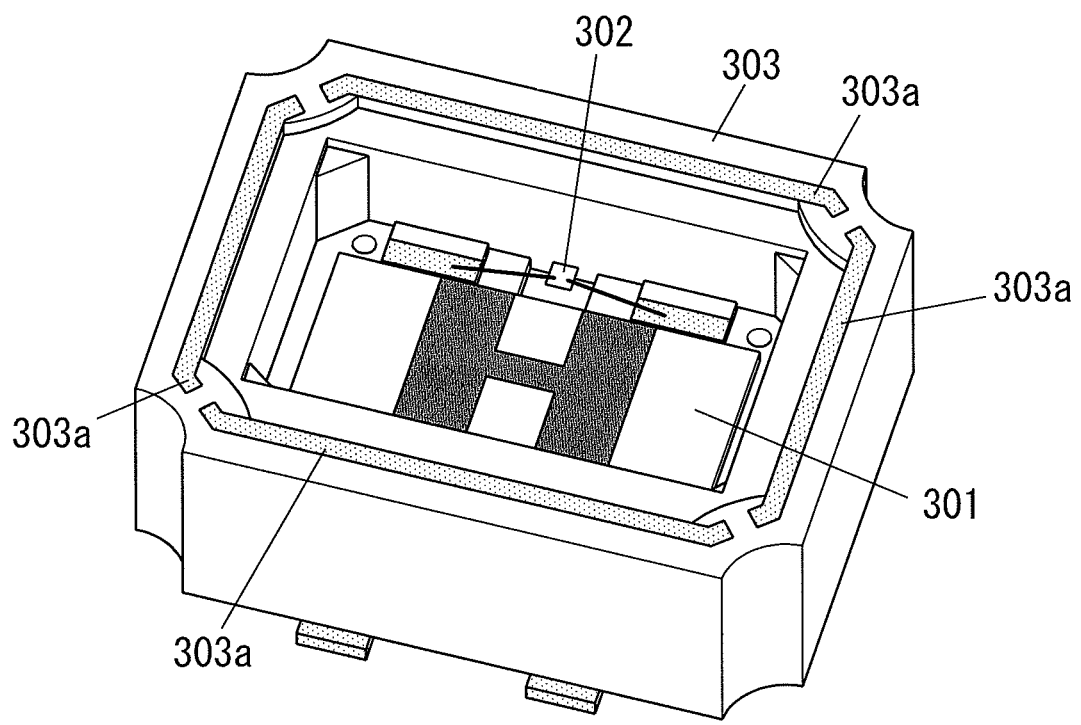
FIG. 16 is a schematic perspective view illustrating the primary part of the foregoing infrared sensor.

Meanwhile, in the configuration of FIG. 15 and FIG. 16, when the infrared sensor element 301 and the IC device 102 (refer to FIG. 12) or the IC device 202 (refer to FIG. 13) are provided horizontally and in parallel in the package 303, there is concern that the infrared rays that entered from the optical filter 304 functioning as the package lid for sealing the opening 303b of the package 303 may have an adverse effect on the circuit part of the IC device 102, 202 or the like. Moreover, in the foregoing case, heat that is generated in the circuit part on the main surface of the IC device 102, 202 is transferred to the infrared sensor element 301, and there is concern that the sensitivity may deteriorate.

In contrast, with regard to the infrared sensor of the present embodiment, the IC device 2 is mounted on the bottom of the lower recessed part 41a in such a manner that the main surface on which the circuit part is formed is oriented toward the bottom surface of the lower recessed part 41a and the rear surface opposite to the main surface is oriented toward the pyroelectric element 1. Thus, it is possible to prevent the adverse effects of the infrared rays that entered from the package lid 5 from being inflicted on the circuit part of the IC device 2 and so on. Moreover, it is possible to inhibit the heat generated in the circuit part on the main surface of the IC device 2 from being transferred to the pyroelectric element 1, and thereby inhibit the deterioration of the sensitivity.

Moreover, in relation to the infrared sensor of the present embodiment, the outer shape of the package body 4 is a square shape in a planar view, and the center of the pyroelectric element 1 is aligned with the center of the package body 4 in the planar view. Thus, it is possible to further reduce the noise caused by an external heat source and easily estimate the position of the pyroelectric element 1 from the outside of the package 3. Therefore, in cases where the lens or the like for condensing the infrared rays onto the pyroelectric element 1 is disposed in front of the package 3, the determination of the position of the lens relative to the pyroelectric element 1 can be facilitated, and the optical design of the lens and the like can also be facilitated. Note that the IC device 2 in the present embodiment is realized with a single chip so that external electronic components (capacitor) and the like are not required.

Moreover, in the infrared sensor of the present embodiment, the pyroelectric element 1 is placed apart from the circuit part of the IC device 2 in the thickness direction of the pyroelectric element 1. In other words, a gap is formed between the pyroelectric element 1 and the IC device 2. Thus, the thermal insulation between the pyroelectric element 1 and the IC device 2 can be improved. Here, both electrodes 12a of the respective light-receiving parts 12 of the pyroelectric element 1 come into contact with a gas that is included in the package 3. Note that, it is preferable to decrease the linear expansion coefficient difference between the pyroelectric material of the pyroelectric element 1 and the foregoing dielectric material of the package body 4 as possible.

Figure 7:
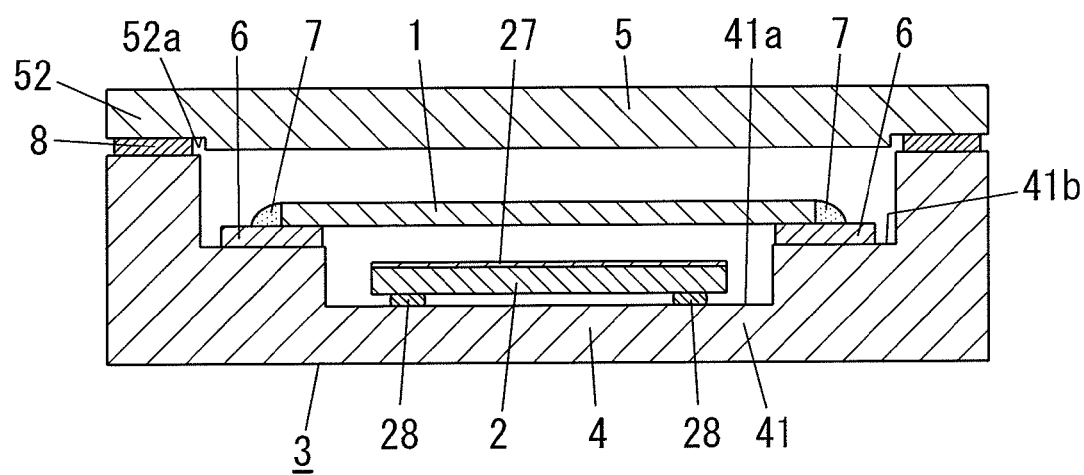
FIG. 7 is a schematic cross section illustrating another configuration example of the foregoing infrared sensor.

In the foregoing infrared sensor, as shown in FIG. 7, the shield member may include a shield layer 27. The shield layer 27 is formed on the rear surface of the IC device 2, thereby being positioned between the pyroelectric element 1 and the output wiring 44 (refer to FIG. 4).

Meanwhile, the IC device 2 is made of a silicon wafer by making use of an IC fabrication technique. The silicon wafer includes an n-type substrate and a p-type substrate. Accordingly, in the foregoing infrared sensor, when the rear surface side part of the IC device 2 is p-type, the shield layer 27 is electrically connected to a part (p-type substrate) of the IC device 2 having the ground potential. Thus, it is possible to inhibit the capacitive coupling of the pyroelectric element 1 and the output wiring 44 connected to the IC device 2 based on the shield effect of the shield layer 27 on the rear face of the IC device 2. Alternatively, in the foregoing infrared sensor, when the rear surface side part of the IC device 2 is n-type, the shield layer 27 is electrically connected to a part (n-type substrate) of the IC device having the constant potential. Thus, it is possible to inhibit the capacitive coupling of the pyroelectric element 1 and the IC device 2 based on the shield effect of the shield layer 27 on the rear surface of the IC device 2. Here, the shielding member may include only the shield layer 27 on the rear surface of the IC device 2. Alternatively, the shielding member may include the shield layer 27 and the shield layer 46 (refer to FIG. 4) formed in the substrate 41 of the package body 4. The shielding member including the shield layers 27 and 46 can more successfully inhibit the capacitive coupling of the pyroelectric element 1 and the output wiring 44. Moreover, the rear surface side part of the IC device 2 (part having the ground potential or the constant potential; that is, the p-type substrate having the ground potential or the n-type substrate having the constant potential) provides the substantially same function as the shield layer 27. Accordingly, the shield layer 27 does not necessarily have to be provided.

Embodiment 2

Figure 8:
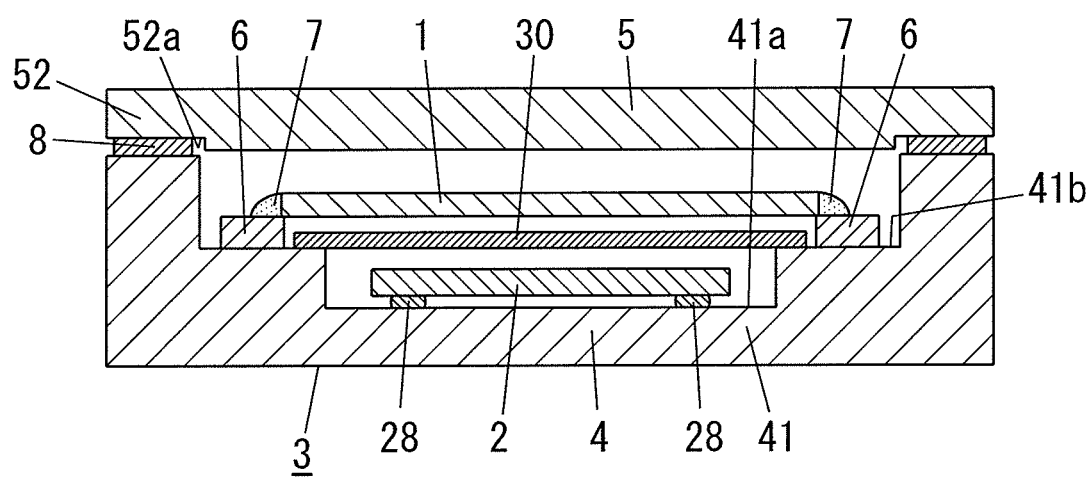
FIG. 8 is a schematic cross section illustrating the infrared sensor of Embodiment 2.

The infrared sensor of the present embodiment has the substantially same basic configuration as Embodiment 1. As shown in FIG. 8, the infrared sensor of the present embodiment is different from Embodiment 1 in that the infrared sensor of the present embodiment includes, as the shielding member, a shield plate 30. The shield plate 30 is disposed between the rear surface of the IC device 2 and the pyroelectric element 1, thereby being positioned between the pyroelectric element 1 and the output wiring 44 (refer to FIG. 4). Note that the same components as Embodiment 1 are designated by the same reference numerals and explanations thereof are deemed unnecessary. Moreover, in FIG. 8, the illustration of the output wiring 44, the external connection electrodes 45, and the shield part 43 of FIG. 4 explained in Embodiment 1 is omitted.

In relation to the infrared sensor of the present embodiment, both ends of the shield plate 30 are fixed to respective parts near the lower recessed part 41a lower than the respective conductive supports 6 at the bottom of the upper recessed part 41b of the package body 4. In addition, a thickness of each conductive support 6 is selected so that a gap of a first predetermined thickness is formed between the pyroelectric element 1 and the shield plate 30 in the thickness direction of the pyroelectric element 1. Moreover, a depth of the lower recessed part 41a (difference in the level between the bottom of the upper recessed part 41b and the bottom of the lower recessed part 41a) is selected in such a manner that a gap of a second predetermined thickness is formed between the shield plate 30 and the rear surface of the IC device 2. Moreover, an external size of the shield plate 30 is selected to be larger than an external size of the IC device 2 and smaller than an external size of the pyroelectric element 1.

With regard to the infrared sensor of the present embodiment, the shield plate 30 is electrically connected to the specific part of the IC device 2 adapted in use to receive the ground potential or the constant potential. Thus, the shield effect of the shield plate 30 on the rear surface of the IC device 2 can inhibit the capacitive coupling of the pyroelectric element 1 and the output wiring 44 (refer to FIG. 4) connected to the IC device 2. Here, the shielding member may include only the shield plate 30. Alternatively, the shielding member may include the shield plate 30 and the shield layer 46 (refer to FIG. 4) formed in the substrate 41 of the package body 4. The shielding member including the shield plate 30 and the shield layer 46 can more successfully inhibit the capacitive coupling of the pyroelectric element 1 and the output wiring 44.

In relation to the foregoing infrared sensor, by making the shield plate 30 of a metal plate or a printed board, it is possible to further inhibit the transfer of heat, which is generated in the IC device 2, to the pyroelectric element 1 in comparison to the configuration of providing the shield layer 27 to the rear surface of the IC device 2 as shown in FIG. 7.

Embodiment 3

Figure 9:
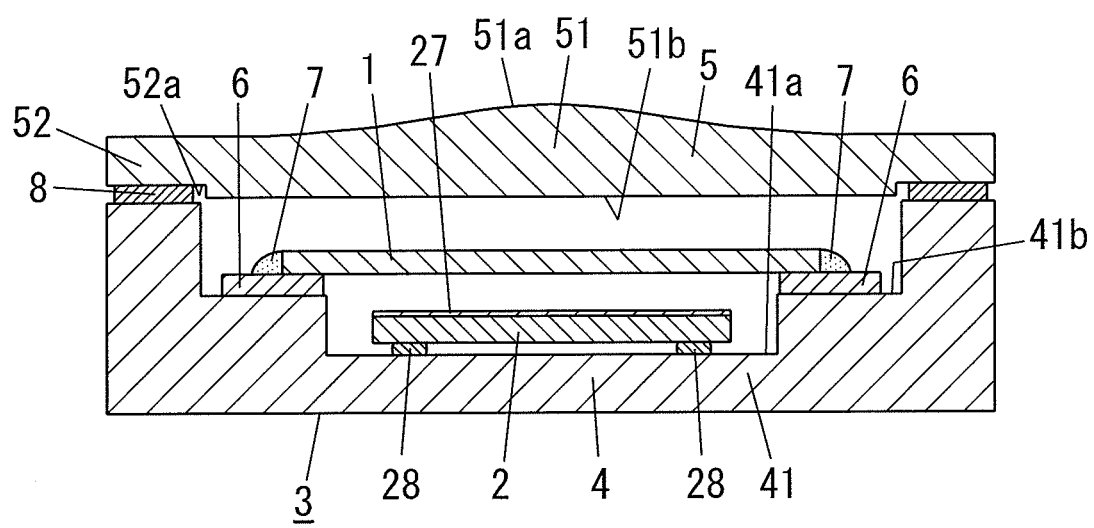
FIG. 9 is a schematic cross section illustrating the infrared sensor of Embodiment 3.

The basic configuration of the infrared sensor of the present embodiment shown in FIG. 9 is substantially the same as Embodiment 1, but differs in that the package lid 5 is a silicon lens. Note that the same reference numeral is given to the same constituent elements as Embodiment 1, and the explanation thereof is omitted. Moreover, in FIG. 9, the illustration of the output wiring 44, the electrodes for external connection 45, and the shield part 43 of FIG. 4 explained in Embodiment 1 is omitted. Moreover, the shielding member is provided in a similar manner as the other embodiments.

With the package lid 5 in the present embodiment, the center part defines a planar convex lens part 51, and the peripheral part 52 defines a flange part used for mounting the package lid 5 on the package body 4.

With regard to the infrared sensor of the present embodiment, the package lid 5 is a silicon lens. Therefore, high sensitivity can be achieved based on the improvement of the light-receiving efficiency of the pyroelectric element 1, and the detection area of the pyroelectric element 1 can be selected using the package lid 5. Moreover, the infrared sensor of the present embodiment can be fabricated at lowered cost, in contrast to an instance where a lens and the package lid 5 are provided as separate parts. The foregoing silicon lens is a semiconductor lens (silicon lens in this example). The semiconductor lens is formed by forming an anode in which a contact pattern of a semiconductor substrate (silicon substrate in this example) according to the intended lens shape such that the contact with the semiconductor substrate on one face side of the semiconductor substrate becomes an ohmic contact, thereafter forming a porous part to become the removed site by anodizing the other face side of the semiconductor substrate in an electrolytic solution made of a solution for etching and removing the oxides of the constituent elements of the semiconductor substrate, and then removing such porous part. Note that, as the method of manufacturing a semiconductor lens by applying this type of anodization technique, the production method disclosed, for example, in Japanese Patent Publication No. 3897055, Japanese Patent Publication No. 3897056 and the like can be applied, and the explanation thereof is omitted.

According to the infrared sensor of the present embodiment, the detection area of the pyroelectric element 1 can be determined using the silicon lens used as the package lid 5. In addition, with the package lid 5 that is manufactured using the manufacturing method of the foregoing semiconductor lens, the lens part 51 can be an aspheric lens having a shorter focus than a spherical lens and which has a large opening size and small aberration. Therefore, it is possible to shorten the focal length. Consequently, the overall infrared sensor can be made thin.

Moreover, with the infrared sensor of the present embodiment, the outer shape of package body 4 is a square shape in a planar view, and the center of the pyroelectric element 1 is aligned with the center of the package body 4 in a planar view. Thus, if the optical axis of the lens part 51 coincides with a center line in the thickness direction of the package lid 5, the relative positional accuracy of the lens part 51 and the pyroelectric element 1 can be improved.

Meanwhile, when the lens used as the package lid 5 is made of polyethylene, the lens is unable to withstand the reflow temperature used for secondarily mounting the package 3 on a circuit board such as a printed-wiring board. Thus, the package lid 5 needs to be fixed to the package body 4 after the reflow process. On the other hand, in the present embodiment, since a silicon lens is used as the package lid 5, there is no need to bond the package lid 5 to the package body 4 after the reflow process.

Figure 10:
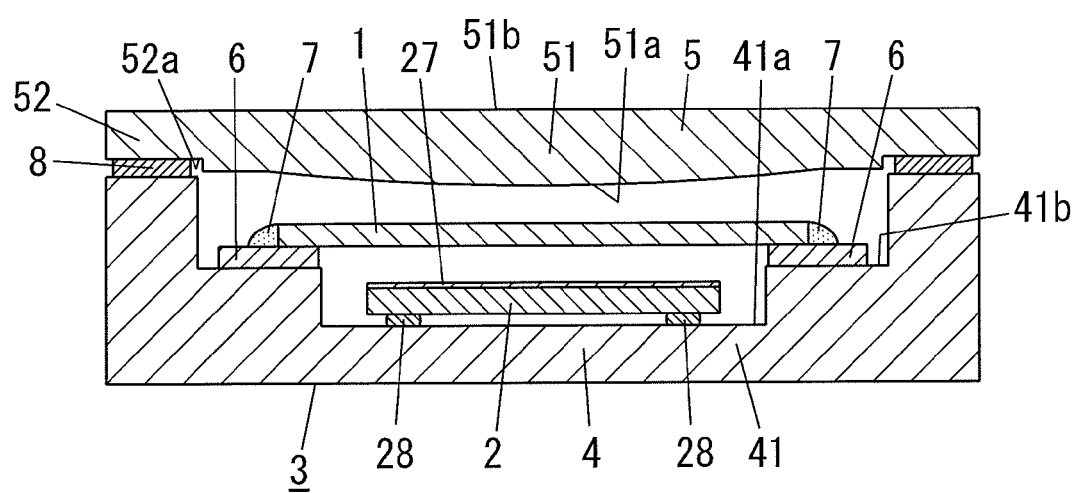
FIG. 10 is a schematic cross section illustrating another configuration example of the foregoing infrared sensor.

Moreover, with the infrared sensor shown in FIG. 9, the package lid 5 is formed so that a planar part 51b of the lens part 51 is positioned on the surface facing the pyroelectric element 1 of the package lid 5 and the convex curved part 51a is positioned on the opposite surface from the pyroelectric element 1 of the package lid 5, but it is not limited thereto. For example, as shown in FIG. 10, the package lid 5 may also be formed so that the convex curved part 51a of the lens part 51 is positioned on the surface facing the pyroelectric element 1 of the package lid 5 and the planar part 51b is positioned on the opposite surface from the pyroelectric element 1 of the package lid 5. In comparison to the configuration of FIG. 9, the handling of the package lid 5 during the assembly is easier than the configuration of FIG. 10, and the lens part 51 will not be damaged easily. Moreover, in either cases of FIG. 9 and FIG. 10, preferably, the package lid 5 includes the filter part as with Embodiment 1.

Note that the package lid 5 shown in FIG. 9 and FIG. 10 may be used in substitute for the package lid 5 in the infrared sensor of Embodiment 2.

Embodiment 4

The basic configuration of the infrared sensor of this embodiment is substantially the same as Embodiment 1, but, as shown in FIG. 11, differs in that it comprises a resin (for instance, polyethylene) housing 9 disposed on the outside of the package 3. Here, the housing 9 is formed in a box shape (rectangular box shape in this example) in which one face thereof is open, and is mounted on the package 3 in a manner of exposing the rear face of the package 3 and covering the peripheral surface and the surface (front face) of the package 3. Note that the same constituent elements as Embodiment 1 are given the same reference numeral and the explanation thereof is omitted. Moreover, in FIG. 11, the illustration of the output wiring 44, the electrodes for external connection 45, and the shield part 43 of FIG. 4 explained in Embodiment 1 is omitted. Moreover, the shielding member is provided in a similar manner as the other embodiments.

With the infrared sensor of the present embodiment, an opening window 9a is formed in the housing 9 so as to be positioned in front of the pyroelectric element 1. A lens 59 configured to transmits infrared rays is fixed in a manner of covering the opening window 9a of the housing 9.

The foregoing lens 59 is, as with Embodiment 3, a semiconductor lens (silicon lens in this example) that is formed by forming an anode in which a contact pattern of a semiconductor substrate (silicon substrate in this example) according to the intended lens shape such that the contact with the semiconductor substrate on one face side of the semiconductor substrate becomes an ohmic contact, thereafter forming a porous part to become the removed site by anodizing the other face side of the semiconductor substrate in an electrolytic solution made of a solution for etching and removing the oxides of the constituent elements of the semiconductor substrate, and then removing such porous part.

Consequently, with the infrared sensor of the present embodiment, the lens 59 is fitted into the opening window 9a of the housing 9. Therefore, it is possible to increase the light-receiving efficiency of the pyroelectric element 1, and adjust the detection area of the pyroelectric element 1 by using the lens 59.

With the infrared sensor of the present embodiment, the housing 9 is mounted on the package 3 in a manner of forming an air space 10 with the package 3 excluding a part used for attaching the housing 9 to the package 3.

Consequently, the infrared sensor of the present embodiment includes the plastic housing 9 disposed at the outside of the package 3. Therefore, the housing 9 functions as the insulating cover. Consequently, the infrared sensor is insusceptible to the fluctuation of the outside heat. Note that the same housing 9 of the present embodiment can also be provided to the other embodiments.

Moreover, in relation to the infrared sensor of this embodiment, the thermal conduction from the housing 9 to the package 3 can be prevented by the air space 10. Consequently, the infrared sensor is more insusceptible to the changes in the outside temperature.

With the infrared sensor of this embodiment, the housing 9 is fixed to the package 3 by means of engaging an engaging concave part 31 provided to the side face of the package 3 and an engaging convex part 94 provided to the housing 9.

Consequently, with regard to the infrared sensor of the present embodiment, a separate member is not required for attaching the housing 9 to the package 3. Accordingly, the number of parts for assembling the infrared sensor can be decreased, and the production cost can be lowered. Further, the housing 9 can be easily attached to the package 3, and the housing 9 can also be mounted in an attachable/detachable manner.

Meanwhile, the foregoing housing 9 includes a plurality of connecting legs 93. Each connecting leg 93 protrudes from the rear end of the housing 9. Each connecting leg 93 is provided at its front end with an engaging convex part 94 functioning as a locking claw. The housing 9 is connected (attached) to the package 3 by means of meshing the engaging convex part 94 of the respective connection legs 93 with the engaging concave part 31 of the package 3. Here, the housing 9 is formed in a rectangular shape with its rear face open. The two connecting legs 93 extend from the rear edge of each of the two opposite side walls in a direction where the two conductive supports 6 are arranged. Moreover, the engaging convex part 94 of the respective connecting legs 93 is formed with an inclined face 94*a* that is inclined so that the amount of protrusion from the connecting legs 93 to the side face of the package 3 is made smaller towards a tip of the engaging convex part 94 than at a bottom of the engaging convex part 94. In the example shown in FIG. 11, the housing 9 can be mounted on the package 3 only by using the flexure of the connecting legs 93. Therefore, the housing 9 can be easily mounted on the package 3.

With each of the foregoing embodiments, the explanation is made to an instance where the IC device 2 is mounted on the package body 4 via flip-chip bonding. When the shielding member comprises the shield layer 46 explained in Embodiment 1 or the shield plate 30 of Embodiment 3, the IC device 2 may be mounted face up on the package body 4. In this alternative, the IC device 2 may be electrically connected to the package body 4 via a bonding wire.

What is claimed is:

1. An infrared sensor comprising:
   a pyroelectric element;
   an IC device configured to process an output signal of said pyroelectric element; and
   a surface-mounted package configured to house said pyroelectric element and said IC device, wherein
   said IC device has a main surface provided with a circuit part and a rear surface opposite to said main surface,
   said IC device is mounted on said bottom of said lower recessed part such that said main surface and said rear surface face said bottom of said lower recessed part and said pyroelectric element, respectively,
   said package includes a package body and a package lid,
   said package body comprising a substrate made of a dielectric material, a circuit wiring, and a plurality of external connection electrodes, said circuit wiring and the plurality of said external connection electrodes being made of a metal material and formed on said substrate,
   said package lid being configured to transmit infrared rays to be detected by said pyroelectric element,
   said package lid being bonded to said package body in a manner of enclosing with said package body said pyroelectric element and said IC device,
   said package body being provided in its surface with plural recessed parts arranged in tiers,
   said IC device being mounted on a bottom of a lower recessed part of said recessed parts,
   said pyroelectric element being mounted on a bottom of an upper recessed part of said recessed parts closer to the surface of said package body than said lower recessed part is, so as to extend across said lower recessed part and to be away from said IC device in a thickness direction thereof,
   said package body including an output wiring and a shielding member, said output wiring being configured to electrically connect an output terminal of said IC device to said external connection electrodes, said shielding member being interposed between said pyroelectric element and said output wiring, and
   said IC device including a specific part adapted in use to receive at least one of a ground potential or a constant potential, and said shielding member being electrically connected to said specific part of said IC device.

2. The infrared sensor as set forth in claim 1, wherein said shielding member comprises a shield layer embedded in said substrate of said package body and positioned between said pyroelectric element and said output wiring, and
   said shield layer being electrically connected to said specific part of said IC device adapted in use to receive the at least one of the ground potential or the constant potential.

3. The infrared sensor as set forth in claim 1, wherein said shielding member comprises a shield layer formed on an inner face of said substrate of said package body and positioned between said pyroelectric element and said output wiring, and
   said shield layer being electrically connected to said specific part of said IC device adapted in use to receive the at least one of the ground potential or the constant potential.

4. The infrared sensor as set forth in claim 1, wherein said shielding member comprises a shield layer positioned between said pyroelectric element and said output wiring, said shield layer including one part embedded in said substrate of said package body and a remaining part formed on an inner face of said substrate, and
   said shield layer being electrically connected to said specific part of said IC device adapted in use to receive the at least one of the ground potential or the constant potential.

5. The infrared sensor as set forth in claim 1, wherein said shielding member comprises a shield layer provided to said rear surface of said IC device and positioned between said pyroelectric element and said output wiring, and
   said shield layer being electrically connected to said specific part of said IC device adapted in use to receive the at least one of the ground potential or the constant potential.

6. The infrared sensor as set forth in claim 1, wherein said shielding member comprises a shield plate interposed between said rear surface of said IC device and said pyroelectric element so as to be interposed between said pyroelectric element and said output wiring, and
   said shield plate being electrically connected to said specific part of said IC device adapted in use to receive the at least one of the ground potential or the constant potential.

7. The infrared sensor as set forth in claim 6, wherein said shield plate is made of at least one of a metal plate or a printed board.

8. The infrared sensor as set forth in claim 1, wherein an outer shape of said package body is a square shape in a planar view, and
   a center of said pyroelectric element is aligned with a center of said package body in the planar view.

9. The infrared sensor as set forth in claim 1, wherein said package lid is provided at its periphery with a stepped part for positioning said package lid relative to said package body.

10. The infrared sensor as set forth in claim 1, wherein said package lid is a silicon lens.

11. The infrared sensor as set forth in claim 1, further comprising a plastic housing disposed outside said package.

12. The infrared sensor as set forth in claim 11, wherein said housing is mounted on said package in a manner of forming with said package an air space, excluding a part used for attaching said housing to said package.

13. The infrared sensor as set forth in claim 11, wherein said housing is mounted on said package by engaging an engaging recessed part provided to a side face of said package body and an engaging protruded part provided to said housing.

14. The infrared sensor as set forth in claim 1, wherein said pyroelectric element is made of a pyroelectric material selected from one of lithium tantalate and lithium niobate.

\* \* \* \* \*